(12) United States Patent
Harmon (10) Patent No.: US 12,411,110 B2
(45) Date of Patent: *Sep. 9, 2025

(54) CROWDED SENSOR (71) Applicant: Zomedica Biotechnologies LLC, Ann Arbor, MI (US)

(72) Inventor: Ian Harmon, Golden Valley, MN (US)

(73) Assignee: Zomedica Biotechnologies LLC, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/615,461

(22) Filed: Mar. 25, 2024

(65) Prior Publication Data
US 2024/0230594 A1 Jul. 11, 2024

Related U.S. Application Data (63) Continuation of application No. 16/369,401, filed on Mar. 29, 2019, now Pat. No. 11,940,414.

(51) Int. Cl.
G01N 29/22 (2006.01)
G01N 29/02 (2006.01)
H03H 9/02 (2006.01)
H10N 30/079 (2023.01)

(52) U.S. Cl.
CPC ....... *G01N 29/022* (2013.01); *H03H 9/02574* (2013.01); *H10N 30/079* (2023.02); *G01N 2291/0231* (2013.01); *G01N 2291/0422* (2013.01); *G01N 2291/0426* (2013.01)

(58) Field of Classification Search
None
See application file for complete search history.

(56) References Cited

U.S. PATENT DOCUMENTS

| | | | |
|---|---|---|---|
| 4,640,756 A | 2/1987 | Wang et al. | |
| 5,932,953 A | 8/1999 | Drees et al. | |
| 8,409,875 B2 | 4/2013 | Johal et al. | |
| 10,234,425 B2 | 3/2019 | Salvati et al. | |
| 2004/0038195 A1 | 2/2004 | Nerenberg et al. | |
| 2006/0194342 A1 | 8/2006 | Bond | |
| 2009/0258440 A1* | 10/2009 | Bunch | G01N 33/54353 422/69 |
| 2014/0170654 A1* | 6/2014 | Landegren | C12Q 1/6876 536/24.3 |
| 2017/0110300 A1 | 4/2017 | McCarron et al. | |
| 2018/0048280 A1* | 2/2018 | Ryder | H03H 9/175 |

* cited by examiner

*Primary Examiner* — Erica S Lin
(74) *Attorney, Agent, or Firm* — Standley Law Group LLP; Jeffrey S. Standley; Bryan P. Finneran (57) ABSTRACT A sensor device includes a sensor, which may include an acoustic wave resonator structure, having a surface to which analyte capture ligand is bound. The device also includes a crowding agent to reduce the ratio of binding of an analyte in a sample composition to the analyte capture ligand when the sample composition is flowed across the surface of the sensor.

20 Claims, 7 Drawing Sheets

CROWDED SENSOR

CROSS-REFERENCE TO RELATED APPLICATIONS

This application is a continuation application claiming priority to U.S. application Ser. No. 16/369,401, filed on Mar. 29, 2019, which is hereby incorporated by reference in its entirety as if fully recited herein.

TECHNICAL FIELD

The present disclosure relates to sensor devices, such as acoustic wave sensor devices having biomolecules configured to bind an analyte.

BACKGROUND

Fluidic devices having acoustic wave sensors for detecting the presence of an analyte in a sample often have biomolecules, such as antibodies or other proteins such as receptors, polynucleic acids, or the like, or other analyte capture ligands attached to their surfaces. The analyte may bind to the biomolecule or other analyte capture ligand attached to the surface of the sensor and increase the mass bound to the sensor. The increased mass alters the wave propagation characteristics (e.g., magnitude, frequency, phase, etc.) of the sensor. The change in propagation characteristics due to analyte binding may be correlated with the amount of bound analyte and, thus, the amount of analyte in the sample.

The rate of the change in propagation characteristics due to analyte binding may be correlated with the amount of analyte in the sample. Using the rate of change, as opposed to magnitude of change, may be beneficial when the concentration of analyte in the sample is sufficiently high to cause binding saturation because the signal from the sensor also becomes saturated. That is, the use of kinetics may be more sensitive than the use of the magnitude of the change because, once saturation or equilibrium is reached, additional changes in magnitude of signal may not be obtainable.

Analyte binding kinetics need to be determined in the time frame between initial analyte binding to the surface of the sensor and saturation or equilibrium. When the concentration of analyte in the sample is high, the time frame for detecting binding kinetics may be short and may present some practical challenges.

SUMMARY

The present disclosure relates to, among other things, devices having sensors comprising surfaces to which analyte capture ligands are bound and which include crowding agents to reduce the rate of binding of analytes in sample compositions to the analyte capture ligands when the sample compositions are flowed across the surfaces of the sensors. In some preferred embodiments the sensors comprise acoustic wave resonator structures, such as bulk acoustic wave sensor structures. The sensor devices described herein may extend the time frame over which analyte binding kinetics may be detected relative to sensor devices that do not include crowding agents. Slowing the binding kinetics may increase the ability to capture sensor data prior to binding saturation to more accurately determine the concentration of analyte in the sample.

While it is possible to achieve similar results by diluting the sample, diluting the sample may not be advantageous in various circumstances. For example, diluting the sample may add complexity to the processes or devices and may increase the propensity for error. Additionally, when testing samples for the presence of multiple analytes by employing an array of acoustic wave resonator structures having different analyte capture ligands on their surfaces, sample dilution may beneficial for high concentration analytes but may be detrimental for low concentration analytes.

Reducing the concentration of analyte capture ligand on the surface of the sensor will result in a lower signal intensity but will not affect the time to saturation. In contrast, the use of a crowding agent as described herein to reduce the binding kinetics maintains the amount of analyte capture ligand on the surface of the sensor and thus maintains the potential signal intensity of the sensor.

In various embodiments, the sensing devices described herein allow for detection of high concentration of molecules without sample dilution as well as multiplexing of high and low concentration of analytes in the same microfluidic channel via use of multiple sensors.

In some aspects described herein, a sensing device includes a first sidewall and a second sidewall, which may be a single sidewall structure that forms opposing sides. A fluid channel is defined between the first sidewall and the second sidewall. The sensing device further includes a sensor having a surface defining at least a portion of the channel, and an analyte capture ligand that is bound to the surface of the sensor. The sensing device also includes a crowding agent bound to the surface of the sensor. The sensor may comprise an acoustic wave resonator structure, such as a bulk acoustic wave resonator structure.

In some aspects described herein, a sensing device includes a first sidewall and a second sidewall. A fluid channel is defined between the first sidewall and the second sidewall, which may be a single sidewall structure that forms opposing sides. The sensing device further includes a sensor having a surface defining at least a portion of the channel, and an analyte capture ligand that is bound to the surface of the sensor. The sensing device also includes cover disposed over, and coupled to, the first and second sidewalls. A surface of the cover defines at least a portion of the channel opposing the surface of the sensor. The sensing device further includes a crowding agent bound to the surface of the cover, a surface of the sidewall, or both a surface of the cover and a surface of the sidewall. If the crowding agent is bound to the surface of the cover, the surface of the cover is positioned sufficiently close to the surface of the sensor for the crowding agent to slow kinetics of analyte binding to the analyte capture ligand when a fluid sample composition comprising the analyte is flowed through the channel and across the surface of the sensor. Preferably, gaps exist in the crowing agent to allow a fluid sample composition to flow across or in proximity to the surface of the sensor. The sensor may comprise an acoustic wave resonator structure, such as a bulk acoustic wave resonator structure.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain one or more principles of the disclosure.

FIGS. 9A-B are graphs illustrating the effects of reducing density of analyte capture ligand on response and reaction kinetics.

FIGS. 10A-B are graphs illustrating the effect of 40 kDa PEG crowding agent on sensor response to 1 ug/ml and 100 ug/ml of antigen.

The figures are rendered primarily for clarity and, as a result, the schematic drawings are not necessarily drawn to scale. Moreover, various structure/components may be shown diagrammatically or removed from some or all of the views to better illustrate aspects of the depicted embodiments, or where inclusion of such structure/components is not necessary to an understanding of the various exemplary embodiments described herein. The lack of illustration/description of such structure/components in a particular figure is, however, not to be interpreted as limiting the scope of the various embodiments in any way.

Like numbers used in the figures refer to like components, steps and the like. However, it should be understood that the use of a number to refer to a component in a given figure is not intended to limit the component in another figure labeled with the same number. In addition, the use of different numbers to refer to components is not intended to indicate that the different numbered components cannot be the same or similar.

DETAILED DESCRIPTION

In the following detailed description several specific embodiments of compounds, compositions, apparatuses, systems and methods are disclosed. It is to be understood that other embodiments are contemplated and may be made without departing from the scope or spirit of the present disclosure. The following detailed description, therefore, is not to be taken in a limiting sense.

The present disclosure relates to, among other things, sensor devices having sensor that include surfaces to which analyte capture ligands are bound and which include crowding agents to reduce the rate of binding analytes in fluid sample compositions to the analyte capture ligands when the sample compositions are flowed across the surfaces of the sensors. Slowing the binding kinetics may increase the ability to capture sensor data prior to binding saturation to more accurately determine the concentration of analyte in the sample.

In the absence of a crowding agent, measurement of binding of analyte to the surface of the sensor presents challenges when the analyte is present in the sample at high concentrations due to how fast the binding reaches saturation. Some of these challenges and mechanisms to address these challenges are described in, for example, U.S. Pat. No. 8,409,875 to Johal et al, entitled MEASUREMENT OF BINDING KINETICS WITH A RESONATING SENSOR, issued on Apr. 2, 2013, which patent is hereby incorporated herein in its entirety to the extent that it does not conflict with the disclosure presented herein.

The sensing devices described herein may employ any suitable sensor. Preferably, the sensor comprises an acoustic resonator structure. An acoustic wave resonator employs an acoustic wave that propagates through or on the surface of a piezoelectric material, whereby changes to the characteristics of the propagation path affect the velocity and/or amplitude of the wave. Presence of an analyte capture on or over an active region of an acoustic wave device permits an analyte to be bound to the analyte capture ligand, thereby altering the mass being vibrated by the acoustic wave and altering the wave propagation characteristics (e.g., velocity, thereby altering resonance frequency). Changes in velocity can be monitored by measuring the frequency, magnitude, or phase characteristics of the acoustic wave device and can be correlated to a physical quantity being measured.

The acoustic wave devices describe herein may include a piezoelectric crystal resonator. With such devices, an acoustic wave may embody either a bulk acoustic wave (BAW) propagating through the interior of a substrate, or a surface acoustic wave (SAW) propagating on the surface of the substrate. SAW devices involve transduction of acoustic waves (commonly including two-dimensional Rayleigh waves) utilizing interdigital transducers along the surface of a piezoelectric material, with the waves being confined to a penetration depth of about one wavelength.

BAW devices typically involve transduction of an acoustic wave using electrodes arranged on opposing top and bottom surfaces of a piezoelectric material. In a BAW device, three wave modes may propagate, namely, one longitudinal mode (embodying longitudinal waves, also called compressional/extensional waves), and two shear modes (embodying shear waves, also called transverse waves), with longitudinal and shear modes respectively identifying vibrations where particle motion is parallel to or perpendicular to the direction of wave propagation. The longitudinal mode is characterized by compression and elongation in the direction of the propagation, whereas the shear modes consist of motion perpendicular to the direction of propagation with no local change of volume. Longitudinal and shear modes propagate at different velocities. In practice, these modes are not necessarily pure modes as the particle vibration, or polarization, is neither purely parallel nor purely perpendicular to the propagation direction. The propagation characteristics of the respective modes depend on the material properties and propagation direction respective to the crystal axis orientations. The ability to create shear displacements is beneficial for operation of acoustic wave devices with fluids (e.g., liquids) because shear waves do not impart significant energy into fluids. BAW devices include bulk acoustic resonators deposited on one or more reflective layers, such as Bragg mirror, and film bulk acoustic resonators having an air-gap.

The sensing devices described herein may employ any suitable piezoelectric thin film. Certain piezoelectric thin films are capable of exciting both longitudinal and shear mode resonance, such as hexagonal crystal structure piezoelectric materials including (but not limited to) aluminum nitride (AlN) and zinc oxide (ZnO). To excite a wave including a shear mode using a piezoelectric material layer arranged between electrodes, a polarization axis in a piezoelectric thin film is generally non-perpendicular to (e.g., tilted relative to) the film plane. In sensing applications involving liquid media, the shear component of the resonator is preferably used. In such applications, piezoelectric material may be grown with a c-axis orientation distribution that is non-perpendicular relative to a face of an underlying substrate to enable a BAW resonator structure to exhibit a dominant shear response upon application of an alternating current signal across electrodes thereof. Conversely, a piezoelectric material grown with a c-axis orientation that is perpendicular relative to a face of an underlying substrate will exhibit a dominant longitudinal response upon application of an alternating current signal across electrodes thereof.

Figure 1:
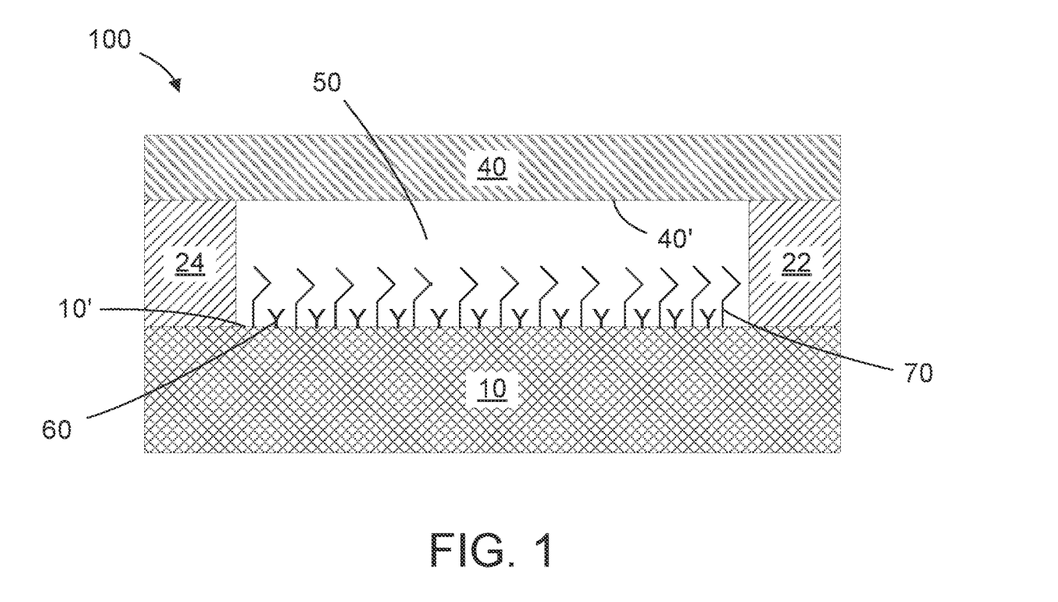
FIGS. 1-4 are schematic cross sectional views of embodiments of portions of sensor devices including, among other things, crowding agents.

Referring now to FIG. 1, a schematic sectional view of a portion of a sensing device 100 is shown. The device 100 includes a first sidewall 22 and a second sidewall 24. While shown as separate structures, it will be understood that the first 22 and second 24 sidewalls may be formed from one continuous sidewall having opposing sides. Whether one structure or separate structures, the first 22 and second 24 sidewalls define a fluidic channel 50. The device 100 also includes a sensor 10, which may comprise an acoustic wave resonator structure such as a bulk acoustic wave resonator structure, having a surface 10' defining at least a portion of the channel 50. An analyte capture ligand 60 is bound to the surface 10' of the resonator structure 10, such that the analyte capture ligand 60 is in fluid communication with the fluidic channel 50. Accordingly, when a sample containing a target analyte is flowed through the channel, the target analyte may bind to the analyte capture ligand 60 and add mass to the surface of the sensor 10. The change of mass may be transduced by the sensor 10 to produce an electrical signal that correlates to the change in mass.

The analyte capture ligand 60 may be applied to all or a portion of the surface 10' of the sensor 10. If applied to less than all of the surface 10' a blocking material may be applied to those portions of the surface 10' to which the analyte capture ligand 60 is not bound. Further information on processes that may be employed to coat portion of a surface 10' of a resonator structure 10 and to block a portion of a surface 10' of a resonator structure 10 is provided in U.S. Patent Application Publication No. 20180048280, entitled ACOUSTIC RESONATOR DEVICE WITH CONTROLLED PLACEMENT OF FUNCTIONALIZATION MATERIAL and published on Feb. 15, 2018, which application is hereby incorporated herein by reference in its entirety to the extent that it does not conflict with the disclosure presented herein.

If the analyte capture ligand 60 is bound to only a portion of the surface 10', the analyte capture ligand 60 may be considered to be bound in an active zone of the sensor 10. Additional information regarding active zones of sensors that include resonator structures is described in U.S. Patent Application Publication No. 20180048280.

The analyte capture ligand 60 may be present on the surface 10' at any suitable concentration. In some embodiments, the amount of the analyte capture ligand 60 dispensed to the surface 10' of the resonator structure 10 is from about 0.1 fg/$\mu$m$^2$ to about 1000 fg/$\mu$m$^2$. For example, the amount of the analyte capture ligand 60 bound to the surface 10' of the resonator structure 10 may be from about 1 fg/$\mu$m$^2$ to about 500 fg/$\mu$m$^2$ or from about 10 fg/$\mu$m$^2$ to about 200 fg/$\mu$m$^2$.

Any suitable analyte capture ligand 60 may be employed. The analyte capture ligand employed will depend on the analyte to be detected. Non-limiting examples of target analytes include nucleic acids, proteins, peptides, antibodies, enzymes, carbohydrates, chemical compounds, or infectious species such as bacteria, fungi, protozoa, viruses and the like. In certain applications, the target analyte is capable of binding more than one analyte capture ligand 60.

Preferably, the analyte capture ligand 60 selectively binds to target analyte. Non-limiting examples of analyte capture ligands 60 include nucleic acids, nucleotide, nucleoside, nucleic acids analogues such as PNA and LNA molecules, proteins, peptides, antibodies including IgA, IgG, IgM, IgE, binding fragments of antibodies, lectins, enzymes, enzymes cofactors, enzyme substrates, enzymes inhibitors, receptors, ligands, kinases, Protein A, Poly U, Poly A, Poly lysine, triazine dye, boronic acid, thiol, heparin, polysaccharides, coomassie blue, azure A, metal-binding peptides, sugar, carbohydrate, chelating agents, prokaryotic cells and eukaryotic cells.

An analyte capture ligand 60 may be bound to the surface 10' of the sensor 10 by covalent binding or non-covalent binding, such as one or more of hydrogen binding, ionic binding, electrostatic forces, Pi-effects, hydrophobic effects, van der Waals forces, and the like. Preferably, the analyte capture ligand 60 is sufficiently bound to the surface 10' of the sensor 10 to remain bound to the surface 10' during use of the device 100. For example, binding of the analyte capture ligand 60 preferably can withstand the flow of fluids, such as sample or wash compositions or buffers employed during use of the device 100, across the surface 10' of the sensor 10.

Any suitable method for binding an analyte capture ligand 60 to the surface 10' of the sensor 10 may be used. By way of example, a uniform coating of epoxy silane may be deposited on the surface 10' using a vapor deposition process. Test and reference analyte capture ligands 60, such as antibodies, may then be deposited onto the test and sensors 10 using, for example, piezo based nanodispensing technology. Primary amines on the antibodies may react with the epoxide groups covalently binding the antibody to the surface 10'. By way of further example, a thiol group, if present, of the analyte capture ligand 60 may bind to a thiol moiety on the surface 10' or gold on the surface 10'. The surface 10' of the sensor 10 may be modified, as appropriate or necessary, to permit binding of the analyte capture ligand 60. Still referring to FIG. 1, the device 100 includes a cover 40 disposed over, and coupled to, the first 22 and second 24 sidewalls. The cover 40 has a surface 40' that defines at least a portion of the channel 50 opposing the surface 10' of the resonator structure 10.

The device 100 includes a crowding agent 70 bound to the surface 10 of the resonator structure 10. The coating density of the crowding agent 70 on the surface 10' is sufficiently high to reduce the rate at which an analyte in a sample flowed through the channel 50 binds the analyte capture ligand 60. It should be understood that effective density ranges may vary depending on the nature of the crowding agent 70 and analyte capture ligand 60 employed. In some embodiments, the ratio of the crowding agent relative to immobilized analyte capture ligand 70 bound to the surface 10' of the resonator structure 10 is from about 100 to 1 to about 0.1 to 1 ratio of crowding reagent to binding reagent. For example, the concentration of the crowding agent 70 bound to the surface 10' of the resonator structure 10 may be from about 25 to 1 to about 0.01 to 1 ratio of crowding reagent to binding reagent or from about 1 to 1 to about 0.25 to 1 molar ratio of crowding reagent to binding reagent.

Any suitable crowding agent 70 may be employed. In some embodiments, the crowding agent is a polymer. Conditions for polymer synthesis may be controlled to achieve a polymer of suitable length, branching, etc. to sufficiently crowd the analyte capture ligand 60 to reduce the rate at which an analyte in a sample flow through the channel 50 binds the capture ligand 60. Examples of polymers that may be employed as crowding agents 70 include polyethylene glycol (PEG), branched polymers formed by the copolymerization of sucrose and epichlorohydrin (e.g., Ficoll™), dextran, and polyvinyl alcohol.

One preferred polymer for use as a crowding agent 70 is PEG. Preferably, the PEG is a long chain PEG. For example, the PEG may have a molecular weight of from about 5 kDa to about 200 kDa, such as from about 20 kDa to about 80 kDa, from about 30 kDa to about 50 kDa, or about 40 kDa.

Additional examples of suitable crowding agents 70 include polypeptides or proteins, such as bovine serum albumin, and polynucleotides such as DNA.

The crowding agents 70 may be bound to the surface 10' of sensor 10 in any suitable manner. For example, the crowding agent 70 may be bound to the surface 10' by covalent binding or non-covalent binding, such as one or more of hydrogen binding, ionic binding, electrostatic forces, Pi-effects, hydrophobic effects, van der Waals forces, and the like. Preferably, the crowding agent 70 is sufficiently bound to the surface 10' to remain bound during use of the device 100. For example, binding of the crowding agent 70 preferably can withstand the flow of fluids, such as sample or wash compositions or buffers that may be employed during the use of the device 100, across the surface 10' of the sensor 10.

Any suitable method for binding a crowding agent 70 to the surface 10' of the resonator structure 10 may be used. By way of example, a uniform coating of epoxy silane may be deposited on the surface 10' using a vapor deposition process. The crowding agent 70 may contain or be modified to contain amine groups (e.g., amino PEGs) and may be deposited onto the surface 10' using, for example, piezo based nanodispensing technology. Primary amines on the crowding agent 70 may react with the epoxide groups covalently binding the crowding agent 70 to the surface 10'. By way of further example, a thiol group, if present, of the crowding agent 70 (e.g., mercapto-PEG) may bind to a thiol moiety on the surface 10' or gold on the surface 10'. The surface 10' of the sensor 10 may be modified, as appropriate or necessary, to permit binding of the crowding agent 70. Biotin labelled crowding agents (e.g., biotin labelled PEG) may bind a surface 10' containing streptavidin or avidin.

In some embodiments, the crowding agent is a non-organic material, such as silicon which may be patterned on the surface 10' to effectively crowd the analyte capture ligand 60.

Figure 2:
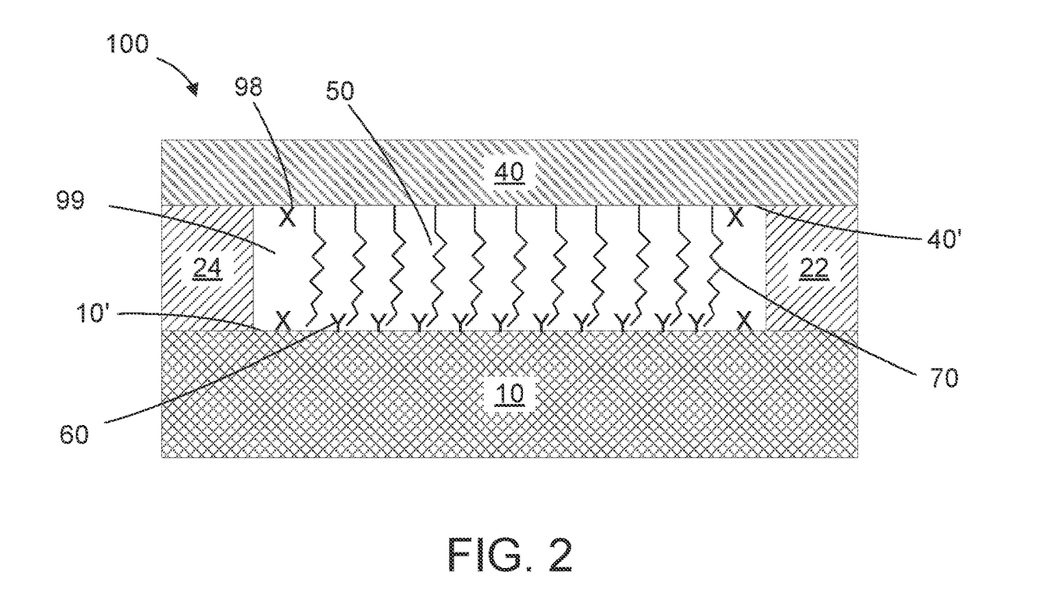

Referring now to FIG. 2, a schematic sectional view of an alternative embodiment of a portion of a sensing device 100 is shown. The device 100 includes a first sidewall 22 and a second sidewall 24, which may be formed from one continuous sidewall or separate structures. The first 22 and second 24 sidewalls define a fluidic channel 50. The device 100 also includes a sensor 10, which may comprise an acoustic resonator structure such as a bulk acoustic resonator structure, having a surface 10' defining at least a portion of the channel 50. An analyte capture ligand 60 is bound to the surface 10' of the sensor 10 (e.g., as described above regarding FIG. 1) such that the analyte capture ligand 60 is in fluid communication with the fluidic channel 50.

The device 100 depicted in FIG. 2 includes a cover 40 disposed over, and coupled to, the first 22 and second 24 sidewalls. The cover 40 has a surface 40' that defines at least a portion of the channel 50 opposing the surface 10' of the resonator structure 10.

The device 100 includes a crowding agent 70 bound to the surface 40' of the cover 40. The crowding agent 70 may be bound to the surface 40' of the cover 40 as discussed above regarding binding of the crowding agent 70 to the surface 10' of the sensor 10 (e.g., as described regarding FIG. 1). The surface 40' of the cover 40 is positioned sufficiently close to the surface 10 of the resonator structure 10 for the crowding agent 70 to slow kinetics of analyte binding to the analyte capture ligand 60 when a fluid sample composition comprising the analyte is flowed through the channel 50 and across the surface 10' of the sensor 10.

The edges of the surface 10' of the sensor 10 and the surface of 40' of the cover 40 are blocked with a blocking agent 98 to prevent the analyte binding molecule 60 and crowding agent 70 from binding to the edges of surfaces 10 and 40' to form a gap 99 in the channel 50 to allow larger molecules in the sample composition to flow through the channel 50. The edges may be blocked as described in U.S. Patent Application Publication No. 20180048280, entitled ACOUSTIC RESONATOR DEVICE WITH CONTROLLED PLACEMENT OF FUNCTIONALIZATION MATERIAL or in any other suitable manner. The gaps 99 may be positioned at any other suitable portion in the channel other than the edges or in addition to the edges. Preferably, the areas of surface 10' that are blocked are registered with the areas of surface 40' that are blocked.

Figure 3:
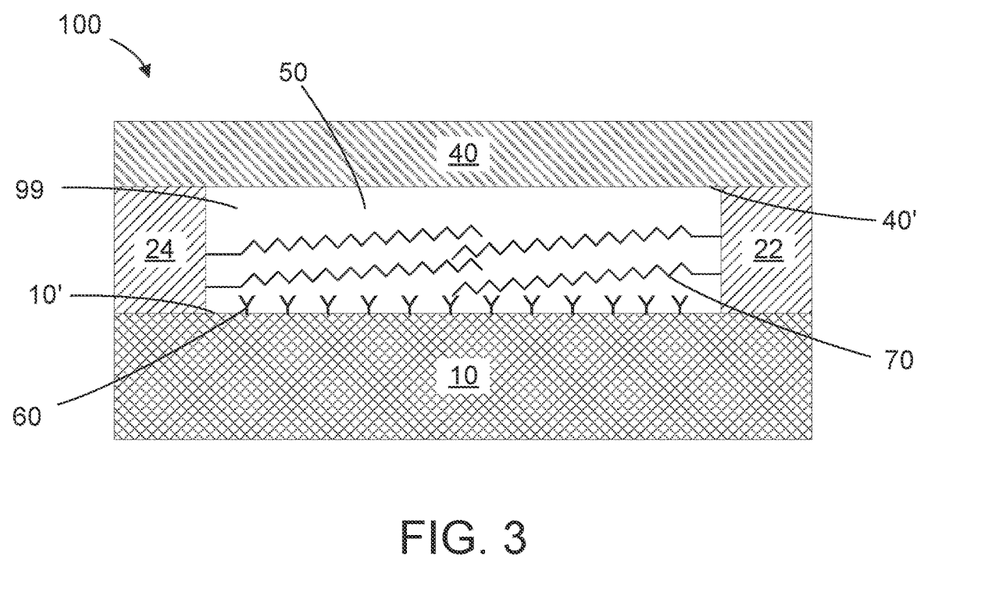

Referring now to FIG. 3, a schematic sectional view of an alternative embodiment of a portion of a sensing device 100 is shown. The device 100 includes a first sidewall 22 and a second sidewall 24, which may be formed from one continuous sidewall or separate structures. The first 22 and second 24 sidewalls define a fluidic channel 50. The device 100 also includes a sensor 10, which may comprise an acoustic resonator structure such as a bulk acoustic resonator structure, having a surface 10' defining at least a portion of the channel 50. An analyte capture ligand 60 is bound to the surface 10' of the sensor 10 (e.g., as described above regarding FIG. 1) such that the analyte capture ligand 60 is in fluid communication with the fluidic channel 50.

The device 100 depicted in FIG. 2 includes a cover 40 disposed over, and coupled to, the first 22 and second 24 sidewalls. The cover 40 has a surface 40' that defines at least a portion of the channel 50 opposing the surface 10' of the resonator structure 10.

The device 100 includes a crowding agent 70 bound to surfaces of the first 22 and second 24 sidewalls that define the channel 50. The crowding agent 70 may be bound to the surfaces of the first 22 and second 24 sidewalls as discussed above regarding binding of the crowding agent 70 to the surface 10' of the sensor 10 (e.g., as described regarding FIG. 1). The length of the crowding agent 70 may be tailored so that most or all the analyte capture agent 60 is crowded by the crowding agent 70. If the crowding agent 70 is not sufficiently long to extent about half way across the channel 50, the surface 10' of the sensor 10 may be blocked in the center (not shown) so that uncrowded capture agent 60 is minimized. The top surface of the sidewalls 22, 24 may be blocked so that a gap may exist at the top of the channel 50 to allow larger molecules in the sample composition to readily flow through the channel 50.

Figure 4:
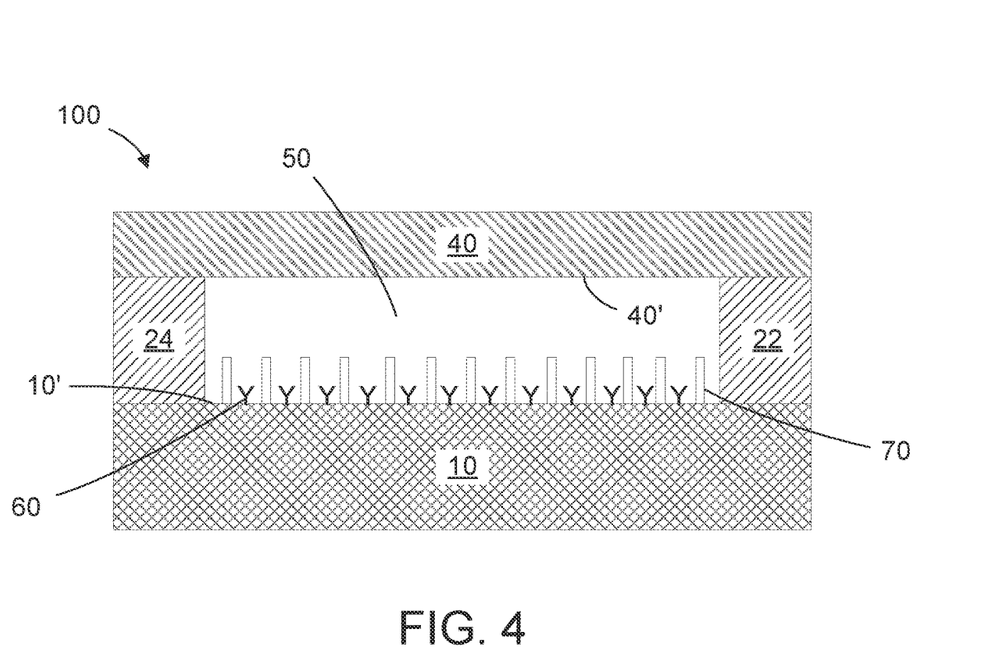

Referring now to FIG. 4, a schematic sectional view of an alternative embodiment of a portion of a sensing device 100 is shown. Like the devices of FIGS. 1-3, the device 100 of FIG. 4 includes a first sidewall 22 and a second sidewall 24, which may be formed from one continuous sidewall or separate structures. The first 22 and second 24 sidewalls define a fluidic channel 50. The device 100 also includes a sensor 10, which may comprise an acoustic wave resonator structure such as a bulk acoustic wave structure, having a surface 10' defining at least a portion of the channel 50. An analyte capture ligand 60 is bound to the surface 10' of the sensor 10 (e.g., as described above regarding FIG. 1) such that the analyte capture ligand 60 is in fluid communication with the fluidic channel 50.

The device 100 includes a crowding agent 70 bound to the surface 10' of the resonator structure 10. The crowding agent 70 forms pillar structures that extend from the surface 10' into the channel 50 and crowd the analyte capture ligand 60 to slow kinetics of analyte binding to the analyte capture ligand 60 when a fluid sample composition comprising the analyte is flowed through the channel 50 and across the surface 10' of the sensor 10.

In some embodiments, the pillars are formed from silicon, which may be formed using standard semiconductor fabrication techniques. Pillars may have any suitable height, which may depend on the nature of the analyte capture ligand 60 or linker employed to attach the analyte capture ligand 60 to the surface 10' of the resonator structure 10. In some embodiments, the pillars have a height from about 200 nm to about 2 nm, such as from about 75 nm to about 5 nm, or from about 20 nm to about 10 nm.

The pillars may be spaced apart by any suitable distance. In some embodiments, the distance between pillars is from about 1000 nm to about 5 nm, such as from about 100 nm to about 10 nm, or from about 50 nm to about 20 nm.

The description provided above is fairly generic regarding a sensor, particularly a resonator structure. Some of the description provided below details embodiments of bulk acoustic resonators that may be employed as a resonator structure. Preferably, the resonator structure comprises a BAW resonator structure arranged over at least a portion of a substrate, and a biomolecule arranged over at least a portion of an active region of the BAW resonator structure. Various layers may be arranged between the biomolecule and a top side electrode (which is coincident with an active region of a BAW resonator structure), such as: a hermeticity layer (e.g., to protect the top side electrode from corrosion in a liquid environment), an interface layer, and/or a self-assembled monolayer (SAM), with the interface layer and/or the SAM being useful to facilitate attachment of at least one overlying material layer, ultimately including functionalization material. In certain embodiments, the interface layer facilitates attachment of an overlying SAM, and the SAM facilitates attachment of an overlying functionalization material.

Figure 5:
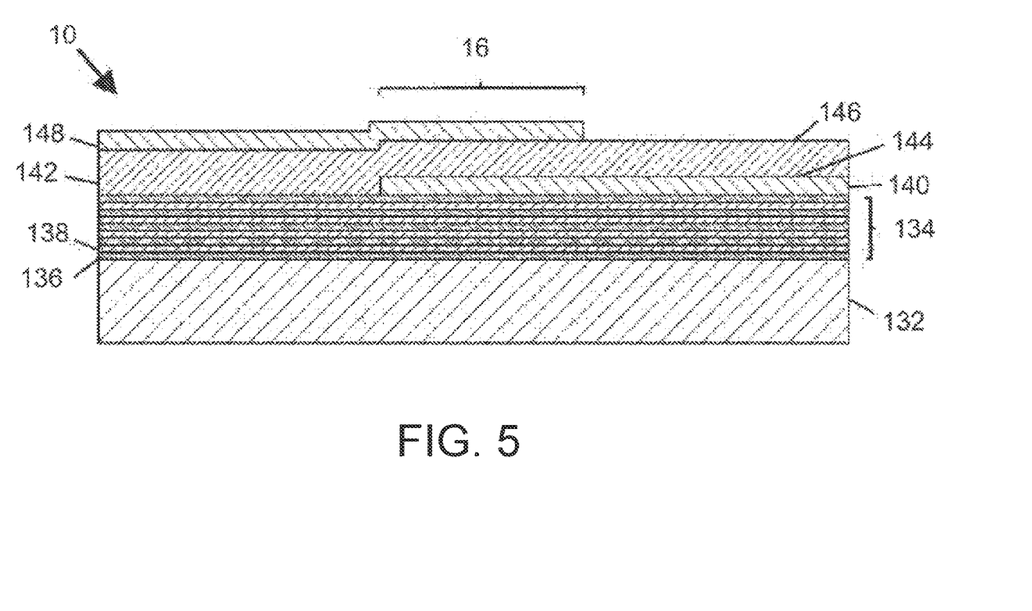
FIG. 5 is a schematic cross-sectional view of a portion of a bulk acoustic wave (BAW) resonator device usable with embodiments disclosed herein, including an active region with a piezoelectric material arranged between overlapping portions of a top side electrode and a bottom side electrode.

FIG. 5 is a schematic cross-sectional view of a portion of a bulk acoustic wave resonator structure 10 useable with embodiments disclosed herein. The resonator structure 10 includes a substrate 132 (e.g., typically silicon or another semiconductor material), an acoustic reflector 134 arranged over the substrate 132, a piezoelectric material 142, and bottom and top side electrodes 140, 148. The bottom side electrode 140 is arranged along a portion of a lower surface 144 of the piezoelectric material 142 (between the acoustic reflector 134 and the piezoelectric material 142), and the top side electrode 148 is arranged along a portion of an upper surface 146 of the piezoelectric material 142. An area in which the piezoelectric material 142 is arranged between overlapping portions of the top side electrode 148 and the bottom side electrode 140 is considered an active region 16 of the resonator device 10 to which an analyte capture ligand and optionally crowding agent (if not on cover or if on both cover and resonator) is preferably applied. The acoustic reflector 134 serves to reflect acoustic waves and therefore reduce or avoid their dissipation in the substrate 132. In certain embodiments, the acoustic reflector 134 includes alternating thin layers 136, 138 of materials (e.g., silicon oxicarbide [SiOC], silicon nitride [$Si_3N_4$], silicon dioxide [$SiO_2$], aluminum nitride [AlN], tungsten [W], and molybdenum [Mo]) having different acoustic impedance values, optionally embodied in a quarter-wave Bragg mirror, deposited over the substrate 132. In certain embodiments, other types of acoustic reflectors may be used. Steps for forming the resonator device 30 may include depositing the acoustic reflector 134 over the substrate 132, followed by deposition of the bottom side electrode 140, followed by growth (e.g., via sputtering or other appropriate methods) of the piezoelectric material 142, followed by deposition of the top side electrode 148.

In certain embodiments, the piezoelectric material 142 comprises a hexagonal crystal structure piezoelectric material (e.g., aluminum nitride or zinc oxide) that includes a c-axis having an orientation distribution that is predominantly non-parallel (and may also be non-perpendicular to) to normal of a face of the substrate 132. Under appropriate conditions, presence of a c-axis having an orientation distribution that is predominantly non-parallel to normal of a face of a substrate enables a BAW resonator structure to be configured to exhibit a dominant shear response upon application of an alternating current signal across a distal electrode and a proximal electrode thereof (e.g., as may be desirable in the context of a BAW resonator structure providing sensing utility). Methods for forming hexagonal crystal structure piezoelectric materials including a c-axis having an orientation distribution that is predominantly non-parallel to normal of a face of a substrate are disclosed in U.S. Patent Application Publication No. 20170110300 entitled DEPOSITION SYSTEM FOR GROWTH OF INCLINED C-AXIS PIEZOELECTRIC MATERIAL STRUCTURES and published on Apr. 20, 2017, which application is hereby incorporated herein by reference to the extent that it does not conflict with the disclosure presented herein. Additional methods for forming piezoelectric materials having an inclined c-axis orientation are disclosed in U.S. Pat. No. 4,640,756 issued on Feb. 3, 1987, which patent is hereby incorporated herein by reference to the extent that it does not conflict with the disclosure presented herein.

The bulk acoustic wave resonator structure 10 shown in FIG. 5 lacks any layers (e.g., including functionalization material) overlying the active region 16 that would permit the resonator device 10 to be used as, for example, a biochemical sensor. If desired, at least portions of the resonator device 10 shown in FIG. 5 (e.g., including the active region 16) may be overlaid with various layers, such as one or more of: a hermeticity layer, an interface layer, a self-assembled monolayer (SAM), and/or a functionalization material layer (which may include specific binding material or non-specific binding material).

Figure 6:
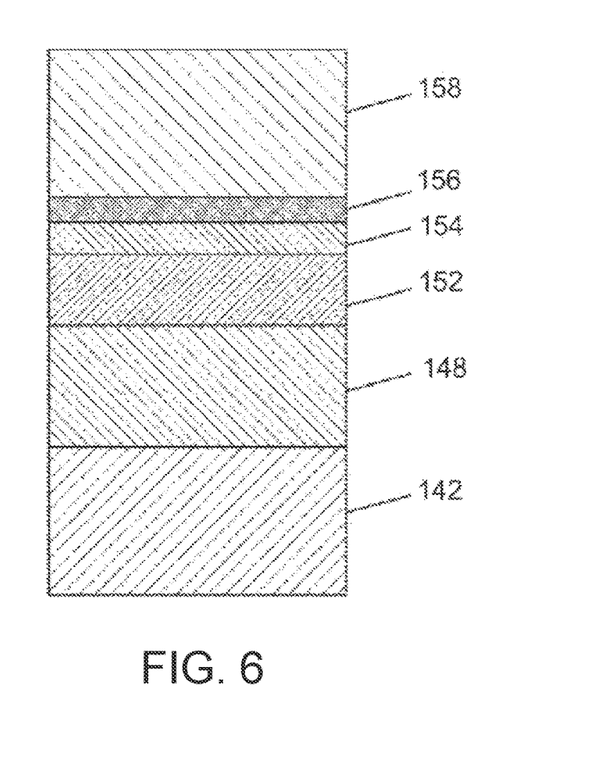
FIG. 6 is a schematic cross-sectional view of an upper portion of a BAW resonator device including a piezoelectric material and a top side electrode overlaid with a hermeticity layer, an interface layer, a self-assembled monolayer, and a layer including analyte capture ligand.

FIG. 6 is a schematic cross-sectional view of an upper portion of a BAW resonator device including a piezoelectric material 142 and a top side electrode 148 overlaid with a hermeticity layer 152, an interface layer 154, a self-assembled monolayer (SAM) 156, and a layer 158 comprising a biomolecule. In certain embodiments, one or more blocking materials (not shown) may be applied during fabrication, such as over portions of an interface layer to prevent localized attachment of one or more subsequently deposited layers, or (if applied over selected regions of a SAM or a functionalization material) to prevent analyte capture in regions not overlying an active region of the BAW resonator device.

In certain embodiments, photolithography may be used to promote patterning of interface material or blocking material over portions of a MEMS resonator device. Photolithography involves use of light to transfer a geometric pattern from a photomask to a light-sensitive chemical photoresist on a substrate and is a process well known to those of ordinary skill in the semiconductor fabrication art. Typical steps employed in photolithography include wafer cleaning, photoresist application (involving either positive or negative photoresist), mask alignment, and exposure and development. After features are defined in photoresist on a desired surface, an interface layer may be patterned by etching in one or more gaps in a photoresist layer, and the photoresist layer may be subsequently removed (e.g., using a liquid photoresist stripper, by ashing via application of an oxygen-containing plasma, or another removal process).

In certain embodiments, an interface layer (e.g., arrangeable between a top side electrode and a SAM) includes a hydroxylated oxide surface suitable for formation of an organosilane SAM. A preferred interface layer material including a hydroxylated oxide surface is silicon dioxide ($SiO_2$). Alternative materials incorporating hydroxylated oxide surfaces for forming interface layers include silicon dioxide [$SiO_2$], titanium dioxide [$TiO_2$], tantalum pentoxide [$Ta_2O_5$], hafnium oxide [$HfO_2$], or aluminum oxide [$Al_2O_3$]. Other alternative materials incorporating hydroxylated oxide surfaces will be known to those skilled in the art, and these alternatives are considered to be within the scope of the present disclosure.

In other embodiments, an interface layer (e.g., arrangeable between a top side electrode and a SAM), or at least one electrode that is devoid of an overlying interface layer, includes gold or another noble metal (e.g., ruthenium, rhodium, palladium, osmium, iridium, platinum, or silver) suitable for receiving a thiol-based SAM that may be overlaid with functionalization material, such as an analyte capture ligand.

In certain embodiments incorporating electrode materials subject to corrosion, a hermeticity layer may be applied between a top side electrode and an interface layer. A hermeticity layer may be unnecessary when noble metals (e.g., gold, platinum, etc.) are used for top side electrodes. If provided, a hermeticity layer preferably includes a dielectric material with a low water vapor transmission rate (e.g., no greater than 0.1 $g/m^2/day$). Following deposition of a hermeticity layer and an interface layer, a SAM may be formed over the interface layer, with the SAM including an organosilane material in certain embodiments. The hermeticity layer protects a reactive electrode material (e.g., aluminum or aluminum alloy) from attack in corrosive liquid environments, and the interface layer facilitates proper chemical binding of the SAM.

In certain embodiments, a hermeticity layer and/or an interface layer may be applied via one or more deposition processes such as atomic layer deposition (ALO), chemical vapor deposition (CVO), or physical vapor deposition (PVO). Of the foregoing processes, ALO is preferred for deposition of at least the hermeticity layer (and may also be preferable for deposition of the interface layer) due to its ability to provide excellent conformal coating with good step coverage over device features so as to provide layer structures that are free of pinholes.

Moreover, ALO is capable of forming uniformly thin layers that provide relatively little damping of acoustic vibrations that would otherwise result in degraded device performance. Adequacy of coverage may be important for a hermeticity layer (if present) to avoid corrosion of the underlying electrode. ALD, chemical vapor deposition, or any other suitable deposition process may be used to apply the hermeticity layer. In certain embodiments, an interface layer may be deposited. In certain embodiments, a hermeticity layer and an interface layer may be sequentially applied in a vacuum environment, thereby promoting a high-quality interface between the two layers. If multiple layers are deposited, they may be deposited sequentially without breaking vacuum, or may be applied separately with vacuum break.

If provided, a hermeticity layer may include an oxide, a nitride, or an oxynitride material serving as a dielectric material and having a low water vapor transmission rate (e.g., no greater than 0.1 $g/m^2/day$) according to certain embodiments. In certain embodiments, a hermeticity layer includes at least one of aluminum oxide ($Al_2O_3$) or silicon nitride (SiN). In certain embodiments, an interface layer includes at least one of $SiO_2$, $TiO_2$, or $Ta_2O_5$. In certain embodiments, multiple materials may be combined in a single hermeticity layer, and/or a hermeticity layer may include multiple sublayers of different materials. Preferably, a hermeticity layer is further selected to promote compatibility with an underlying reactive metal (e.g., aluminum or aluminum alloy) electrode structure of an acoustic resonator structure. Although aluminum or aluminum alloys are frequently used as electrode materials in BAW resonator structures, various transition and post-transition metals can be used for such electrodes.

Following deposition of an interface layer (optionally arranged over an underlying hermeticity layer), a SAM is preferably formed over the interface layer. SAMs are typically formed by exposure of a solid surface to amphiphilic molecules with chemical groups that exhibit strong affinities for the solid surface. When an interface layer comprising a hydroxylated oxide surface is used, then organosilane SAMs are particularly preferred for attachment to the hydroxylated oxide surface. Organosilane SAMs promote surface bonding through silicon-oxygen (Si—O) bonds. More specifically, organosilane molecules include a hydrolytically sensitive group and an organic group and are therefore useful for coupling inorganic materials to organic polymers. An organosilane SAM may be formed by exposing a hydroxylated oxide surface to an organosilane material in the presence of trace amounts of water to form intermediate silanol groups. These groups then react with free hydroxyl groups on the hydroxylated surface to covalently immobilize the organosilane. Examples of possible organosilane-based SAMs that are compatible with interface layers incorporating hydroxylated oxide surfaces include 3-glycidoxypropyltrimethoxysilane (GPTMS), 3-mercaptopropyltrimethoxysilane (MPTMS), 3-aminopropyltrimethoxysilane (APTMS), and octadecyltrimethoxysilane (OTMS), including their ethoxy- and chloro-variants. Additional silanes that may be used for SAMs include poly(ethylene glycol) (PEG) conjugated variants. Those skilled in the art will recognize that other alternatives exist, and these alternatives are considered to be within the scope of the present disclosure. An exemplary SAM may include a thickness in a range of at least 0.5 nm or more. Preferably, a SAM readily binds to the locally patterned interface layer but does not readily bind to other adjacent material layers (e.g., a hermeticity layer, a piezoelectric material, and/or a blocking material layer).

When an electrode and/or interface layer comprising gold or another noble metal is used, then thiol-based (e.g., alkanethiol-based) SAMs may be used. Alkanethiols are molecules with an alkyl chain as the back bone, a tail group, and an S—H head group. Thiols may be used on noble metal interface layers due to the strong affinity of sulfur for these metals. Examples of thiol-based SAMs that may be used include, but are not limited to, 1-dodecanethiol (DDT), 11-mercaptoundecanoic acid (MUA), and hydroxyl-terminated (hexaethylene glycol) undecanethiol (1-UDT). These thiols contain the same backbone, but different end groups—namely, methyl ($CH_3$), carboxyl (COOH), and hydroxyl-terminated hexaethylene glycol (HO—$(CH_2CH_2O)_6$) for DDT, MUA, and 1-UDT, respectively. In certain embodiments, SAMs may be formed by incubating gold surfaces in thiol solutions using a suitable solvent, such as anhydrous ethanol.

Following formation of a SAM, the SAM may be functionalized with an analyte capture ligand, such as by receiving at least one specific binding material. In certain embodiments, specific binding materials may be applied on or over a SAM using a microarray spotting needle or other suitable methods. In certain embodiments, an interface layer may be patterned (e.g., using photolithography for defining the interface layer) with a high dimensional tolerance over only a portion of a resonator structure (which includes a substrate), a SAM may be applied over the interface layer, and a subsequently applied specific binding material may be attached only to the SAM. In certain embodiments, patterning of an interface layer may provide a higher dimensional tolerance for positioning of the specific binding material than could be attained by microarray spotting alone. Examples of specific binding materials include, but are not limited to, antibodies, receptors, ligands, and the like. A specific binding material is preferably configured to receive a predefined target species (e.g., molecule, protein, DNA, virus, bacteria, etc.). A functionalization material including specific binding material may include a thickness in a range of from about 5 nm to about 1000 nm, or from about 5 nm to about 500 nm. In certain embodiments, an array of different specific binding materials may be provided over different active areas of a multi-resonator structure (i.e., one or more resonator structures including multiple active regions), optionally in combination with one or more active areas that are devoid of specific binding materials to serve as comparison (or "reference") regions. In certain embodiments, a functionalization material (e.g., chemical functionalization material) may provide non-specific binding utility.

Certain embodiments are directed to a fluidic device including multiple bulk acoustic wave MEMS resonator structures as disclosed herein and including a fluidic passage (e.g., a channel, a chamber, or the like) arranged to conduct a liquid to contact at least one functionalization (e.g., specific binding) material arranged over at least one active region of the resonator structures. Such a device may be microfluidic in scale, and comprise at least one microfluidic passage (e.g., having at least one dimension, such as height and/or width, of no greater than about 1000 microns, no greater than about 500 microns, or no greater than about 250 microns, or no greater than about 100 microns). For example, following fabrication of bulk acoustic wave MEMS resonator structures and deposition of a SAM over portions thereof (optionally preceded by deposition of a hermeticity layer and an interface layer), a microfluidic device may be fabricated by forming one or more walls defining lateral boundaries of a microfluidic channel over a first bulk acoustic wave MEMS resonator structure with an active region thereof arranged along a bottom surface of a microfluidic passage, and then enclosing the microfluidic passage using a cap or cover layer that may define fluidic ports (e.g., openings) enabling fluid communication with the microfluidic passages. In certain embodiments, functionalization (e.g., specific binding) material may be pre-applied to the active region of a bulk acoustic wave MEMS resonator structure before formation of a microfluidic passage; in other embodiments, functionalization material may be applied over an active region of a bulk acoustic wave resonator structure following formation of the microfluidic passage.

Walls of a microfluidic channel may be formed of any suitable material, such as laser-cut "stencil" layers of thin polymeric materials and/or laminate materials, optionally including one or more self-adhesive surfaces (e.g., adhesive tape).

Optionally such walls may be formed prior to deposition of a SAM layer, functionalization material, and/or blocking layers, with an SU-8 negative epoxy resist or other photoresist material. In certain embodiments, a cover or cap layer may be integrally formed with one or more walls (e.g., via molding or another suitable process) to define a portion of an upper boundary as well as lateral boundaries of at least one fluidic channel, and the integrally formed partial cover/wall structure may be applied (e.g., adhered or otherwise bonded) over at least a portion of a bulk acoustic wave resonator structure to enclose the at least one fluidic channel.

In certain embodiments, a chemical or biological blocking material may be applied over a portion of a SAM to prevent attachment of a functionalization (e.g., specific binding) material over one or more selected regions of a BAW resonator structure (e.g., one or more regions apart from an active region). The proper choice of a chemical or biological blocking material (e.g., blocking buffer) for a given analysis depends on the type of target species or analyte present in a sample. Various types of blocking buffers such as highly purified proteins, serum, or milk may be used to block free sites on a SAM. Additional blockers include ethanolamine or polyethylene oxide (PEO)-containing materials. An ideal blocking buffer would bind to all potential sites of non-specific interaction away from an active region. To optimize a blocking buffer for a particular analysis, empirical testing may be used to determine signal-to-noise ratio. No single chemical blocking material is ideal for every situation, since each antibody-antigen pair has unique characteristics.

Figure 7:
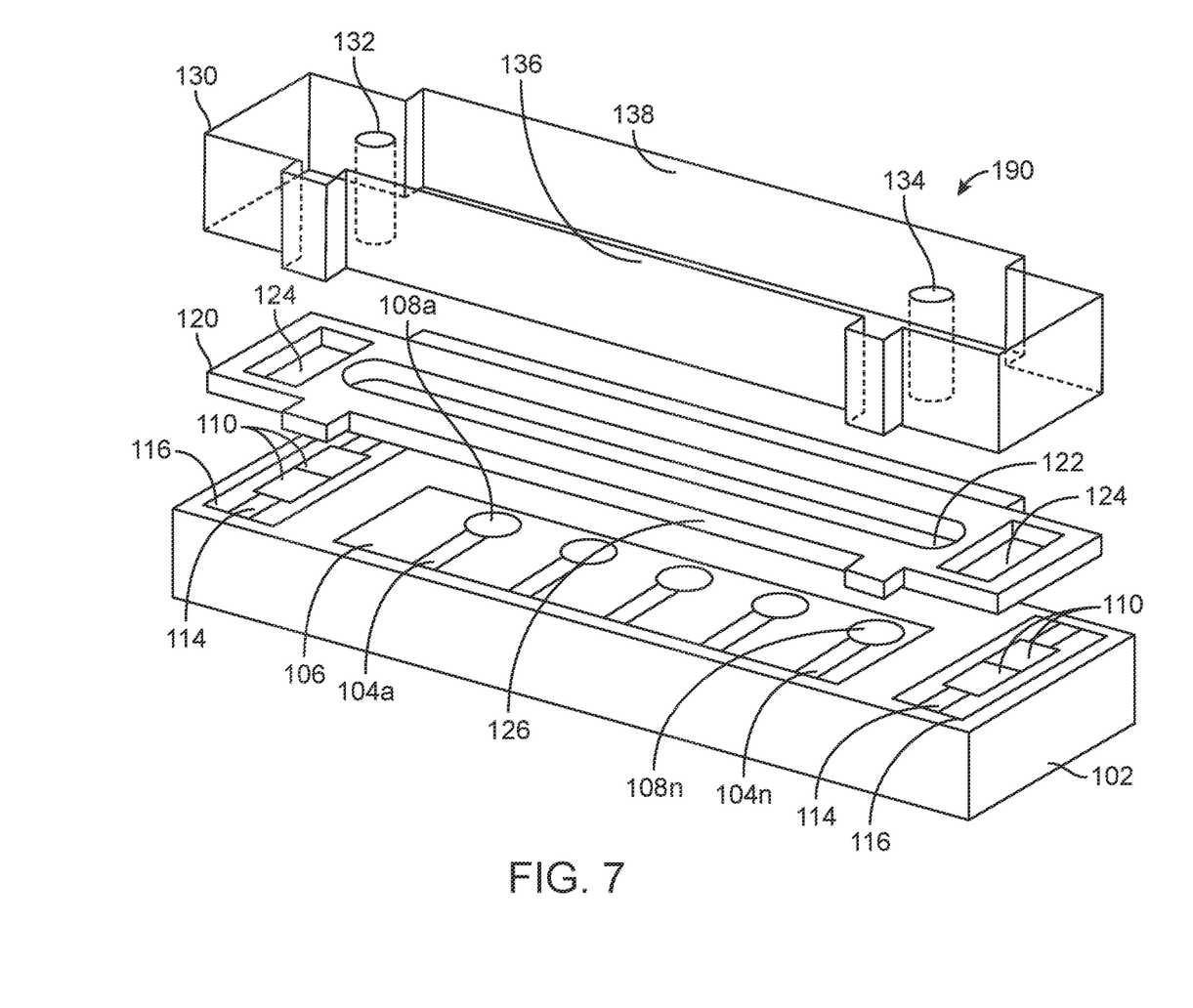
FIG. 7 is a schematic perspective assembly view of a microfluidic device incorporating a substrate with multiple bulk acoustic wave resonator devices as disclosed herein.

FIG. 7 is a perspective assembly view of a microfluidic device 190 incorporating a substrate 102 with multiple bulk acoustic wave resonator devices, an intermediate layer 120 defining a central microfluidic channel 122 registered with active regions 108A-108N (to which analyte capture ligand, or different analyte capture ligands, are attached) of the resonator devices, and a cap or cover layer 130 arranged to cover the intermediate layer 120. The use of different resonator structures with active regions 108A-108N having different analyte capture ligands bound to their surfaces may allow for determining the presence or amount of more than one analyte in a sample composition flowed through the microfluidic channel 122. A crowding agent is used to crowd the analyte capture ligand bound to at least one of the active regions 108A-108N.

Top central portions of the substrate 102, which includes an acoustic reflector (not shown) and a piezoelectric material (not shown), include a top side electrode 106 and bottom side electrodes 104A-104N. Regions in which the foregoing electrodes overlap one another with the piezoelectric material arranged therebetween embody active regions 108A-108N. Any suitable number of active regions 108A-108N may be provided and fluidically arranged in series or parallel, although five active regions are illustrated in FIG. 7. Top peripheral (or top end) portions of the substrate 102 further include reference top side electrodes 116 and reference bottom side electrodes 114 in communication with reference overlap regions 110. Such reference overlap regions 110 are not exposed to fluid and are present to provide a basis for comparing signals obtained from the active regions 108A-108N exposed to fluid within the central microfluidic channel 122. The substrate 102 is overlaid with the intermediate (e.g., wall-defining) layer 120, wherein the central microfluidic channel 122 is intended to receive fluid and defines peripheral chambers 124 arranged to overlie the reference overlap regions 110 in a sealed fashion. The intermediate layer 120 may be formed of any suitable material such as SU-8 negative epoxy resist, other photoresist material, or laser-cut "stencil" layers of thin polymeric materials optionally including one or more self-adhesive surfaces (e.g., adhesive tape), etc. The intermediate layer 120 further includes a lateral inset region 126 that enables lateral portions of the top side electrode 106 and bottom side electrodes 104A-104N to be accessed upon assembly of the microfluidic device 100. The cap or cover layer 130 includes a lateral inset region 136 registered with the lateral inset region 126 of the intermediate layer 120, and includes microfluidic ports 132, 134 accessible along a top surface 138 and registered with end portions of the central microfluidic channel 122 defined in the intermediate layer 120 to permit fluid (e.g., liquid) to be supplied to the central microfluidic channel 122 over the active regions 108A-108N. Preferably, at least the electrodes 104A-104N, 106 are overlaid with a hermeticity layer, an interface layer, a self-assembled monolayer, and biomolecule for binding analyte as disclosed herein.

Microfluidic devices according to other configurations may be provided, as will be recognized by those skilled in the art upon review of the present disclosure. By way of example and with reference to FIG. 8, a system for detecting an analyte may include a container 710 (or more than one container or chamber), the sensor device 730 (such as the one or more sensor device described regarding FIGS. 1-4), actuation circuitry 722, measurement circuitry 729, and control electronics 730. A fluid path couples the one or more containers 710 to the sensor device 730 (such as the channels described regarding FIGS. 1-4 and 6). The control electronics 730 are operably coupled to the actuation circuitry and the measurement circuitry. In embodiments, control electronics 730 are configured to modify the frequency at which the actuation circuitry 722 oscillates the BAW resonator structure 20 based on input from the measurement circuitry 729.

Figure 8:
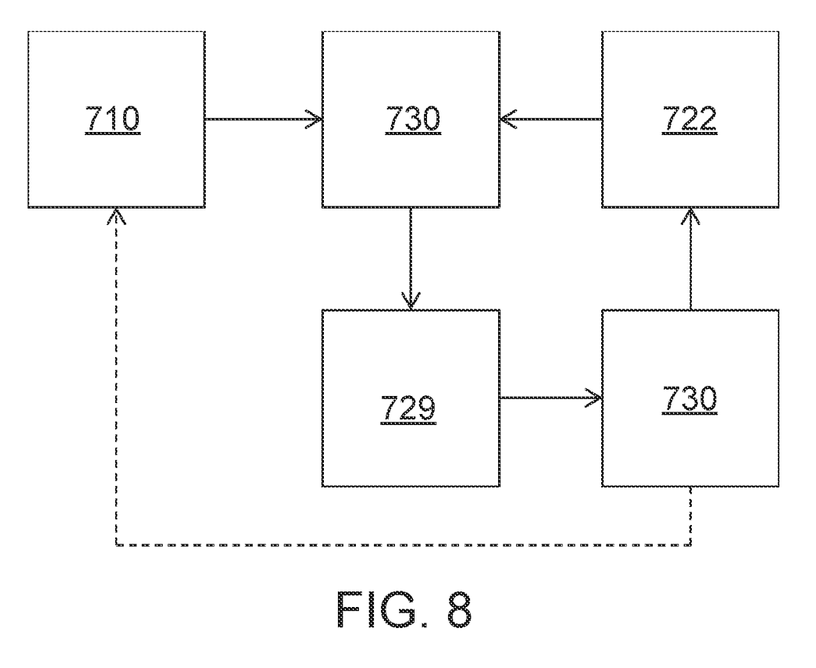
FIG. 8 is a block diagram of illustrating some components of a system according to embodiments described herein.

Any suitable control electronics 730 may be employed. For example, control electronics may include a processor, controller, memory, or the like. Memory may include computer-readable instructions that, when executed by processor or controller cause the device and control electronics to perform various functions attributed to device and control electronics described herein. Memory may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media. Control electronics 30 may include any one or more of a microprocessor, a controller, a digital signal processor (DSP), an application specific integrated circuit (ASIC), a field-programmable gate array (FPGA), or equivalent discrete or integrated logic circuitry. In some examples, control electronics 30 may include multiple components, such as any combination of one or more microprocessors, one or more controllers, one or more DSPs, one or more ASICs, or one or more FPGAs, as well as other discrete or integrated logic circuitry. The functions attributed to control electronics herein may be embodied as software, firmware, hardware or any combination thereof.

Examples of components and processes for monitoring signals from BAW resonators are described in, for example, (a) U.S. Pat. No. 8,409,875 entitled "RESONATOR OPERATING FREQUENCY OPTIMIZATION FOR PHASE-SHIFT DETECTION SENSORS;" and U.S. Pat. No. 5,932,953 issued Aug. 3, 1999 to Drees et al., and U.S. Pat. No. 10,234,425 issued Mar. 19, 2019 to Salvati and Harmon; which patents are hereby incorporated herein by reference in their entirety to the extent that they do not conflict with the disclosure presented herein.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, the term "and/or" includes any and all combinations of one or more of the associated listed items.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising" and the like. As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure, including the claims.

Any direction referred to herein, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

As used herein, "providing" in the context of providing an article or a device means to make, purchase, or otherwise obtain the article or device.

EXAMPLE

Initial proof of concept studies were performed using an anti-equine IgG assay. Briefly, a goat anti-equine Fab' antibody fragment was immobilized by immersion coating with a reduced Fab' fragments utilizing the native thiol to form a dative bond with the gold surface. These devices had a resonate frequency of 2.2 GHz. For crowding agent studies, a 40 kDa thiol PEGs molecules (50 µg/ml) was mixed with the Fab' fragments (100 µg/ml) and both reagents were co-immobilized by immersion coating. Reference devices were coated using the same methodology with an isotype control Fab' fragment. These sensors were then mounted together so that they could be immersed into sample simultaneously. All reagents were stored in microtiter plates and the biosensors were dipped into the plates. Sample agitation was achieved by using stirbars. The testing sequence was as follows, sensors were initially rinsed in a running buffer. A baseline was then established in this running buffer (5-60 seconds). Sensors were then exposed to 1 µg/ml Equine IgG for 60 seconds followed by exposure to 100 ug/ml of equine IgG. Sensors were electrically connected to a network analyzer which was used to monitor the frequency shift of the devices. The reference signal was subtracted from the test signal and this delta signal used as the binding response. In this case, phase resulting in maximum group delay was tracked and change in input frequency to maintain the phase as mass changed was determined. A 50 MHz window around the resonate frequency was collected at a sampling rate of 2 samples per second for both the test and reference resonators. This data was post processed to determine the frequency shift as a function of time for both the test and reference resonators.

Figure 9A:
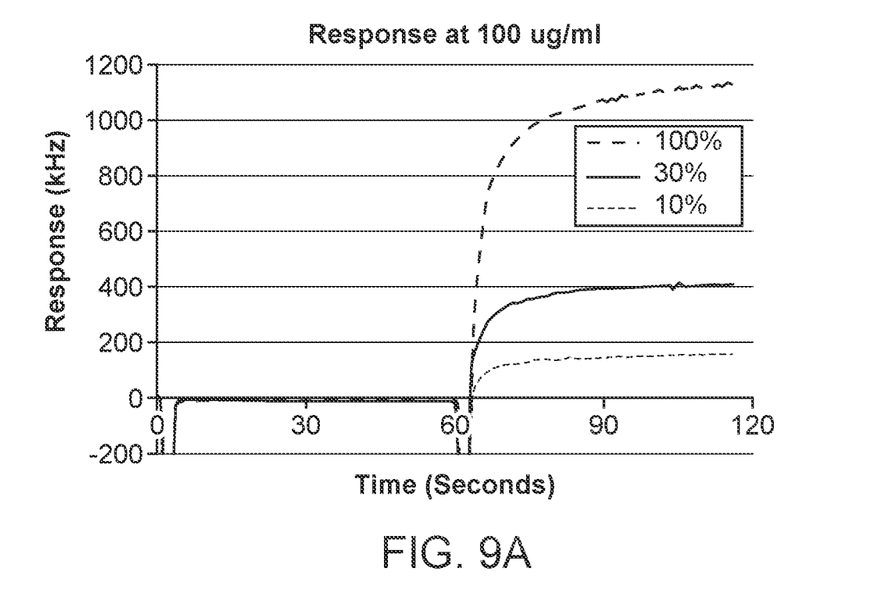
FIG. 9A is a graph of the total response to a sample composition comprising 100 ug/ml of antigen when the surface of the resonator structure is coated with analyte capture ligand at relative densities of 100%, 30%, and 10%.
Figure 9B:
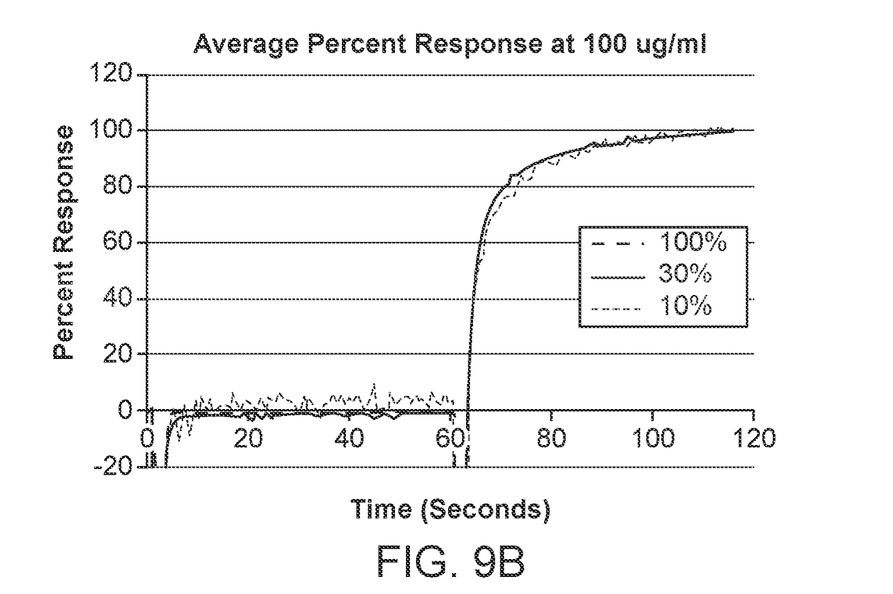
FIG. 9B is a graph in which the data is normalized to the total amount of shift.

Results of this initial study are presented in FIGS. 9A-B and FIGS. 10A-B. FIG. 9A is a graph of the total response to a sample composition comprising 100 ug/ml of antigen when the surface of the resonator structure is coated with analyte capture ligand at relative densities of 100%, 30%, and 10%. The total response to 100 ug/ml of antigen (left) demonstrates that reducing the coating density from 100%-10% reduces the total signal and not the reaction kinetics. When the data is normalized to the total amount of shift (FIG. 9B) the reactions reaches equilibrium in the same time frame independent of the amount of antibody coated on the sensor surface.

Figure 10A:
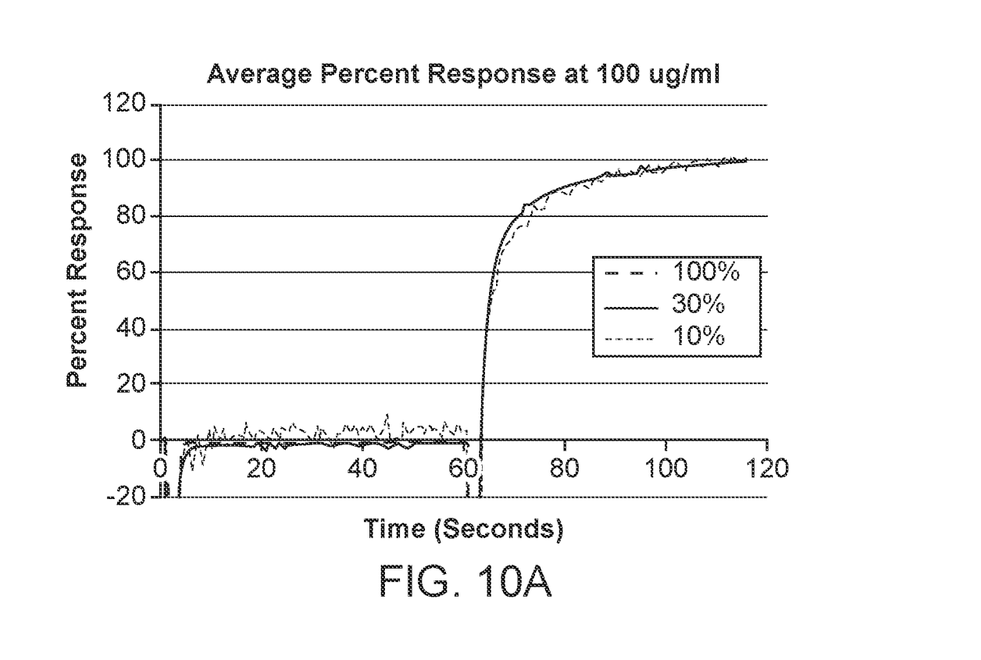
FIG. 10A is a graph of the response when no PEG was used.
Figure 10B:
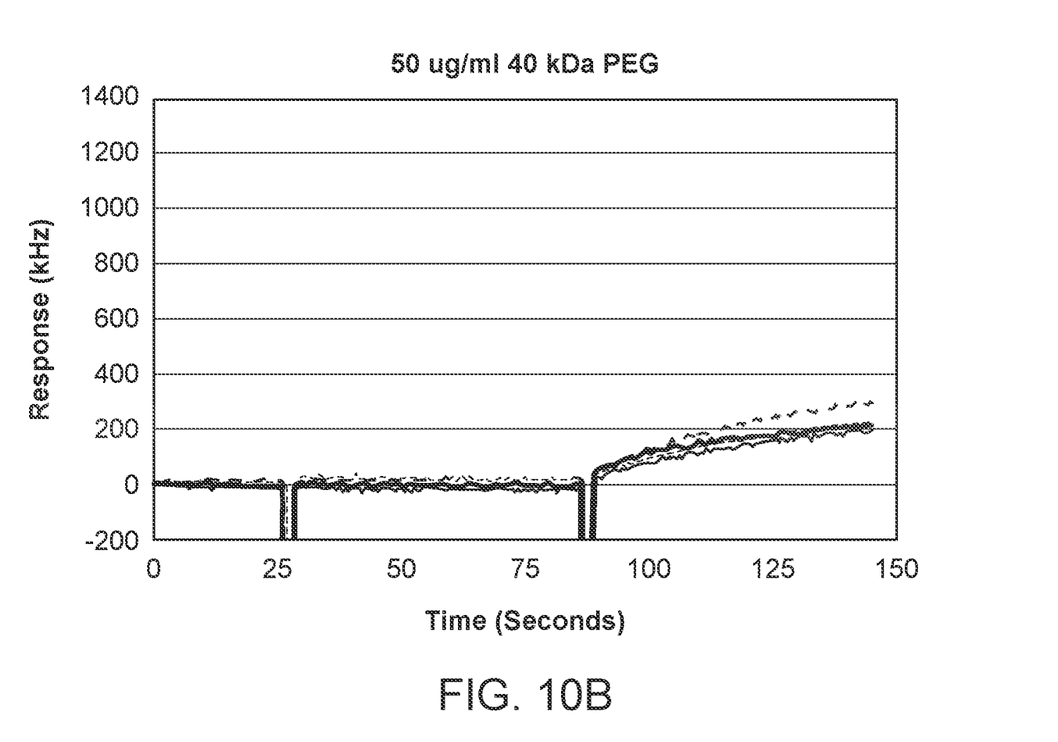
FIG. 10B is a graph of the response when the PEG was used.

The effect of 40 kDa PEG as a crowding agent on sensor response to 1 ug/ml and 100 ug/ml of antigen is shown in FIG. 10A (no PEG) and FIG. 10B (PEG). The sensor co-coated with 40 kDa PEG as a crowding agent shows no response to 1 ug/ml of antigen and a diminished response to 100 ug/ml. The time for the sensor to reach saturation is extended with the presence of the 40 kDa PEG as a crowding agent.

Those skilled in the art will recognize improvements and modifications to the preferred embodiments of the present disclosure. All such improvements and modifications are considered within the scope of the concepts disclosed herein and the claims that follow.

What is claimed is:

1. A system for sensing comprising:
   a fluid channel;
   a sensor at the fluid channel;
   an analyte capture ligand bound to at least a portion of the sensor; and
   a crowding agent bound to at least a portion of the sensor and configured to slow kinetics of target analyte capable of binding to the analyte capture ligand, wherein the crowding agent does not specifically bind to the target analyte.

2. The system of claim 1, wherein the sensor comprises a bulk acoustic wave resonator structure.

3. The system of claim 1, wherein the fluid channel is located proximate to one or more sidewalls.

4. The system of claim 1, wherein a molar ratio of the crowding agent to the analyte capture ligand is from about 50 to 1 to about 0.1 to 1.

5. The system of claim 1, wherein a molar ratio of the crowding agent to the analyte capture agent is from about 2 to 1 to about 0.25 to 1.

6. The system of claim 1, wherein the crowding agent comprises a polymer.

7. The system of claim 1, wherein the crowding agent comprises at least one selected from the group of polyethylene glycol (PEG), a branched polymer formed by copolymerization of sucrose and epichlorohydrin, dextran, polyvinyl alcohol, a polypeptide, and a polynucleic acid.

8. The system of claim 1, wherein the crowding agent comprises a non-organic structure.

9. The system of claim 1, wherein the crowding agent comprises silicon.

10. The system of claim 9, wherein the silicon forms pillars extending from a surface of the sensor.

11. A system for sensing comprising:
    a fluid channel;
    a sensor at the fluid channel;
    an analyte capture ligand bound to at least a portion of the sensor;
    a cover defining at least a portion of the fluid channel; and
    a crowding agent bound to a surface of the cover, at least a portion of the fluid channel, at least a portion of the sensor, or any combination thereof, wherein the crowding agent is configured to slow kinetics of target analyte capable of binding to the analyte capture ligand, and wherein the crowding agent does not specifically bind to the target analyte.

12. The system of claim 11, wherein the sensor comprises a bulk acoustic wave resonator structure.

13. The system of claim 11, wherein the fluid channel is located proximate to one or more sidewalls.

14. The system of claim 11, further comprising one or more gaps formed in the fluid channel.

15. The system of claim 11, wherein a molar ratio of the crowding agent to the analyte capture ligand is from about 100 to 1 to about 0.01 to 1.

16. The system of claim 11, wherein the crowding agent comprises a polymer.

17. The system of claim 11, wherein the crowding agent comprises at least one selected from the group of polyethylene glycol (PEG), ficoll, dextran, polyvinyl alcohol, a polypeptide, and a polynucleic acid.

18. The system of claim 11, wherein the crowding agent comprises a non-organic structure.

19. The system of claim 11, wherein the crowding agent comprises silicon.

20. The system of claim 19, wherein the silicon forms pillars extending from a surface of the sensor.

* * * * *

UNITED STATES PATENT AND TRADEMARK OFFICE
CERTIFICATE OF CORRECTION

PATENT NO. : 12,411,110 B2  
APPLICATION NO. : 18/615461  
DATED : September 9, 2025  
INVENTOR(S) : Ian Harmon Page 1 of 1

It is certified that error appears in the above-identified patent and that said Letters Patent is hereby corrected as shown below:

In the Specification

Column 10, Line 15, please delete "[A1N]" and insert -- [AlN] --.

Column 11, Line 35, please delete "[A1$_2$O$_3$]" and insert -- [Al$_2$O$_3$] --.

Column 12, Line 26, please delete "(A1$_2$O$_3$)" and insert -- (Al$_2$O$_3$) --.

Signed and Sealed this  
Twenty-first Day of October, 2025

John A. Squires  
*Director of the United States Patent and Trademark Office*